United States Patent [19]

Sugimura et al.

[11] Patent Number: 5,600,877
[45] Date of Patent: Feb. 11, 1997

[54] METHOD FOR MANUFACTURING AN ELECTRONIC COMPONENT

[75] Inventors: Toshiaki Sugimura; Shigeo Ojima; Manabu Sumita, all of Nagaokakyo, Japan

[73] Assignee: Murata Manufacturing Co., Ltd., Japan

[21] Appl. No.: 380,299

[22] Filed: Jan. 30, 1995

[30] Foreign Application Priority Data

Feb. 3, 1994 [JP] Japan ..................... 6-033187

[51] Int. Cl.$^6$ .................. H04R 17/00; H04R 19/00; H04R 43/00
[52] U.S. Cl. ................ 29/25.35; 29/843; 29/855
[58] Field of Search ............ 29/843, 855, 856, 29/25.35; 228/207, 214, 223

[56] References Cited

FOREIGN PATENT DOCUMENTS 57-170613  10/1982  Japan ..................... 29/25.35
59-33918   2/1984   Japan ..................... 29/25.35

Primary Examiner—P. W. Echols
Attorney, Agent, or Firm—Ostrolenk, Faber, Gerb & Soffen

[57] ABSTRACT

A flux containing an activator of the nonionic halogen group is used in soldering one end of each of lead terminals 6a and 6b to each of drawing electrodes 5a and 5b of a ceramic element 2. After soldering them, a wax 9 is dripped on the periphery of vibrating electrodes 4a and 4b of the ceramic element 2. Then, an outer resin 10 is applied around the periphery of the ceramic element 2 and so on. By drying the outer resin 10, a solvent contained in the outer resin 10 is dispersed to the outside, and pores are formed in the outer resin 10 on paths through which the solvent has been dispersed. At the same time, a part of a residual flux 11 is absorbed into the pores formed in the outer resin 10. The whole is heated to 150° C. to harden the outer resin 10. When the whole is heated, the wax 9 and the remaining part of the residual flux 11 are absorbed into the pores of the outer resin 10. As a result, a cavity 8 is formed around the periphery of the vibrating electrodes 4a and 4b. When the whole has been heated to 150° C., the outer resin 10 is hardened, and an outer member 7 is formed.

7 Claims, 5 Drawing Sheets

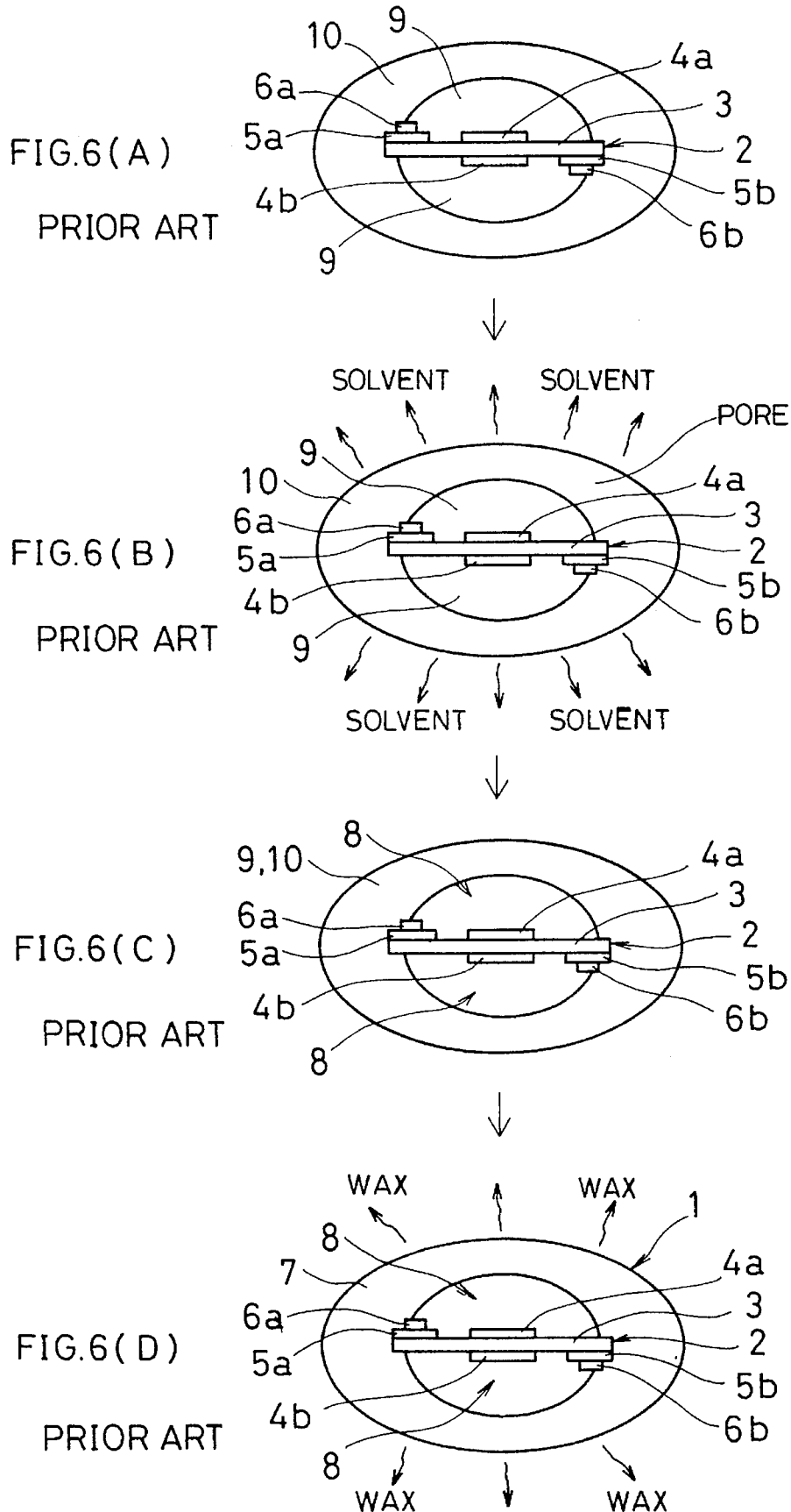

METHOD FOR MANUFACTURING AN ELECTRONIC COMPONENT

BACKGROUND OF THE INVENTION

1. Field of the Invention

The present invention relates to a method for manufacturing an electronic component, more particularly, to a method for manufacturing an electronic component, for example, an oscillator comprising an electronic element such as a ceramic element and a lead terminal soldered to the electronic element.

2. Description of the Prior Art

FIG. 3 is a front view showing an example of a conventional oscillator which is an electronic component in the background of the present invention and to which the present invention can be applied, and FIG. 4 is a sectional illustrative view thereof. An oscillator 1 which will be referred to as an electronic component includes a ceramic element 2 which will be referred to as an electronic element. The ceramic element 2 includes a rectangular piezoelectric substrate 3 made of ceramic. Circular vibrating electrodes 4a and 4b are formed at the center of one main surface of the piezoelectric substrate 3 and the center of the other main surface thereof such that the piezoelectric substrate 3 is sandwiched therebetween, and the vibrating electrodes 4a and 4b are opposed to each other. A drawing electrode 5a is formed on one main surface of the piezoelectric substrate 3 in such a manner that the drawing electrode 5a extends from one end thereof to the vibrating electrode 4a. Similarly, a drawing electrode 5b is formed on the other main surface of the piezoelectric substrate 3 in such a manner that the drawing electrode 5b extends from the other end thereof to the vibrating electrode 4b. One end of each of two lead terminals 6a and 6b having a belt shape is soldered to each of the drawing electrodes 5a and 5b. An outer member 7 made of an outer resin is formed around the periphery of the piezoelectric substrate 3. However, in this case, the outer member 7 is not formed on the periphery of the vibrating electrodes 4a and 4b, but a cavity 8 is formed around the periphery of the vibrating electrodes 4a and 4b to provide a vibrating space for the vibrating electrodes 4a and 4b.

FIG. 5 is a flowchart showing an example of a conventional method for manufacturing the oscillator 1 shown in FIGS. 3 and 4. In the conventional method shown in FIG. 5, at a step S1, the ceramic element 2 is inserted between one end of the lead terminal 6a and one end of the lead terminal 6b wherein the lead terminals 6a and 6b are spaced at a predetermined interval from each other and extending from a frame (not shown). In this case, one end of each of the lead terminals 6a and 6b is placed on the drawing electrodes 5a and 5b of the ceramic element 2, respectively. At a step S2, a flux is applied to portions where the drawing electrodes 5a and 5b are connected with one end of each of the lead terminals 6a and 6b. At a step S3, the drawing electrode 5a and one end of the lead terminal 6a are connected with each other by soldering. Similarly, the drawing electrode 5b and one end of the lead terminal 6b are connected with each other by soldering. At a step S4, a residual flux remaining on the connected portions is cleaned. At a step S5, a wax 9 is dripped on the periphery of the vibrating electrodes 4a and 4b of the ceramic element 2 at a location corresponding to the cavity 8 to be formed. At a step S6, the outer member 7 and the cavity 8 are formed around the periphery of the ceramic element 2 and so on.

The step S6 comprises a plurality of steps. At a first step, as shown in FIG. 6(A), an outer resin 10 to form the outer member 7 is applied to the periphery of the ceramic element 2 and the wax 9. The outer resin 10 consists of a mixture of a thermosetting resin, a solvent, and a filler. At a second step, by drying the outer resin 10, as shown in FIG. 6(B), the solvent contained in the outer resin 10 is dispersed to the outside, and pores are formed in the outer resin 10 on paths through which the solvent has been dispersed. Then, the whole is heated to 150° C. to harden the outer resin 10. At a third step, when the whole is heated, as shown in FIG. 6(C), the wax 9 is absorbed into the pores formed in the outer resin 10, and the cavity 8 is formed around the periphery of the vibrating electrodes 4a and 4b. At a fourth step, when the whole has been heated to 150° C., as shown in FIG. 6(D), the outer resin 10 is hardened, and the outer member 7 is formed around the periphery of the ceramic element 2 and the cavity 8. At the same time, a part of the wax 9 absorbed into the outer resin 10 is dispersed to the outside. Then, the lead terminals 6a and 6b are cut off from the frame (not shown).

In the conventional method shown in FIGS. 5 and 6(A)-(D), since a flux containing an activator of the ionic halogen group is used in the soldering, the residual flux remaining after soldering has a strong corrosivity. Thus, the residual flux corrodes the drawing electrodes and the vibrating electrodes of the ceramic element and the lead terminals, adversely affects the electrical characteristic of the oscillator, and reduces the reliability of the product. In order to maintain the reliability of the product, in the conventional method shown in FIGS. 5 and 6(A)-(D), the residual flux remained after soldering is cleaned with a solvent containing chlorine. However, the solvent containing chlorine destroys the ozone layer and thus it has been decided that the use thereof will be prohibited in the near future.

SUMMARY OF THE INVENTION

Therefore, it is a primary object of the present invention to provide a method for manufacturing an electronic component which can manufacture a reliable electronic component without cleaning a residual flux.

It is another object of the present invention to provide a method for manufacturing an electronic component which can manufacture a reliable electronic component having a vibrating electrode without cleaning a residual flux.

The present invention is a method for manufacturing an electronic component having an electronic element, a lead terminal soldered to said electronic element, and an outer member formed around a periphery of said electronic element, comprising a step of applying a flux containing an activator of the nonionic halogen group to at least one of the electronic element and the lead terminal at a portion to be soldered, a step of soldering the electronic element and the lead terminal to each other, a step of applying an outer resin to the periphery of the electronic element, a step of absorbing a residual flux into the outer resin, and a step of forming the outer member by hardening the outer resin.

In the present invention, the electronic element may be a ceramic element having a vibrating electrode formed on a substrate. In this case, the electronic component may be an oscillator.

Further, in the present invention, the step of applying the outer resin includes a step of applying an outer resin containing a solvent to the periphery of the electronic element, the step of absorbing the residual flux includes a step of forming pores in the outer resin by dispersing the solvent contained in the outer resin to the outside, and a step of absorbing the residual flux into the pores formed in the outer resin.

When the electronic element has a vibrating electrode in the present invention, it is preferable to include a step of forming a cavity around a periphery of the vibrating electrode in order to secure a vibrating space for the vibrating electrode. In this case, the step of forming the cavity includes a step of applying a wax to the periphery of the vibrating electrode before performing the step of applying the outer resin, and a step of absorbing the wax into the outer resin after performing the step of applying the outer resin. In the present invention, the step of absorbing the residual flux and the step of absorbing the wax may be performed simultaneously.

According to the present invention, since a flux containing an activator of nonionic halogen group is used in soldering the electronic element and the lead terminal to each other, a residual flux remaining after soldering them has little corrosivity. Thus, the lead terminal and so on are hardly corroded by the residual flux. Further, the residual flux is absorbed into the outer resin to be used as the material of the outer member. Thus, the residual flux does not remain at the periphery of the lead terminal and so on. Accordingly, the reliability of an electronic component is maintained without cleaning the residual flux with a solvent containing chlorine.

In the present invention, when the electronic element has the vibrating electrode and the cavity is formed around the periphery of the vibrating electrode, the cavity operates as a vibrating space for the vibrating electrode. Accordingly, the reliability of an electronic component having a vibrating electrode is maintained without cleaning the residual flux with a solvent containing chlorine.

According to the present invention, a reliable electronic component can be manufactured without cleaning a residual flux.

Further, according to the present invention, a reliable electronic component having a vibrating electrode can be manufactured without cleaning a residual flux.

The above and other objects, features, aspects and advantages of the present invention will become more apparent from the following detailed description of the embodiments with reference to the accompanying drawings.

BRIEF DESCRIPTION OF THE DRAWINGS

FIGS. 6(A)–(D) are illustrative views showing a process for absorbing a wax in the conventional method shown in FIG. 5.

DESCRIPTION OF THE PREFERRED EMBODIMENTS

Figure 1:
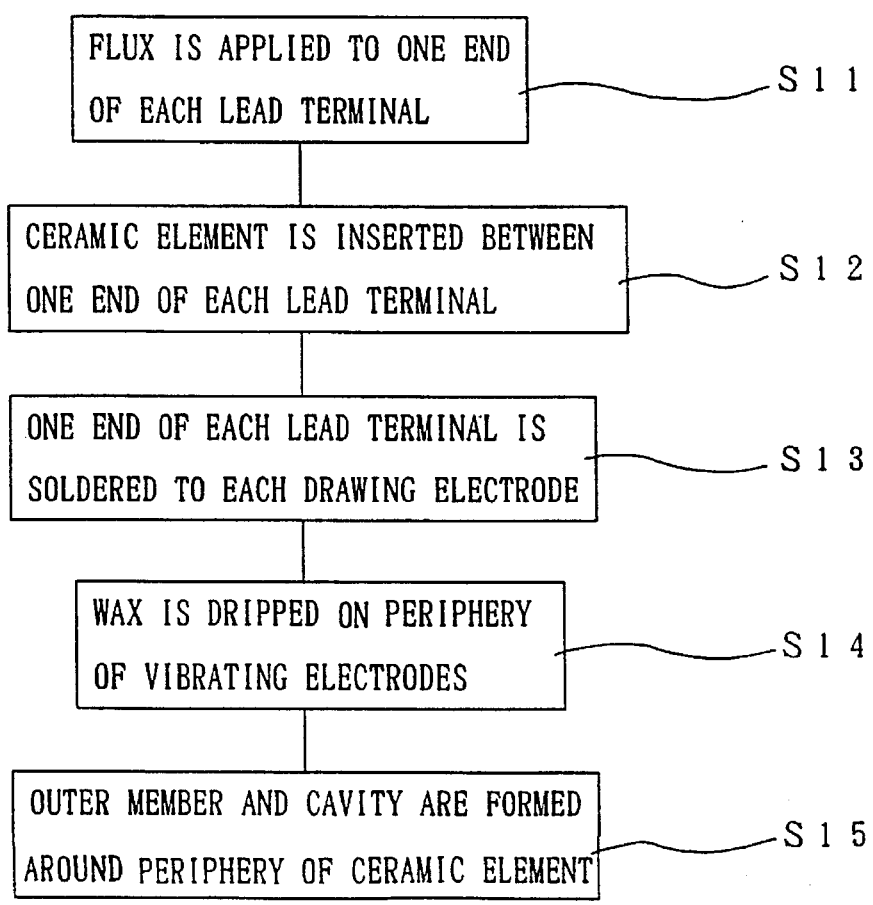
FIG. 1 is a flowchart showing an embodiment of the present invention.
Figure 3:
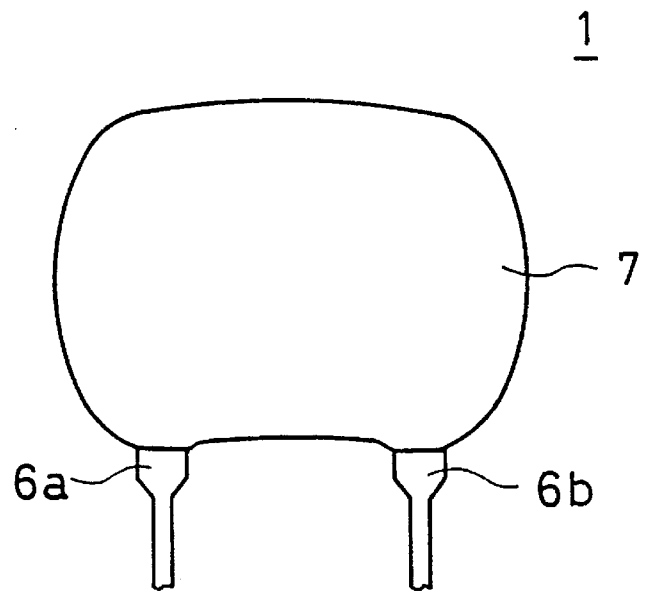
FIG. 3 is a front view showing an example of a conventional oscillator which is an electronic component in the background of the present invention and to which the present invention is applied.
Figure 4:
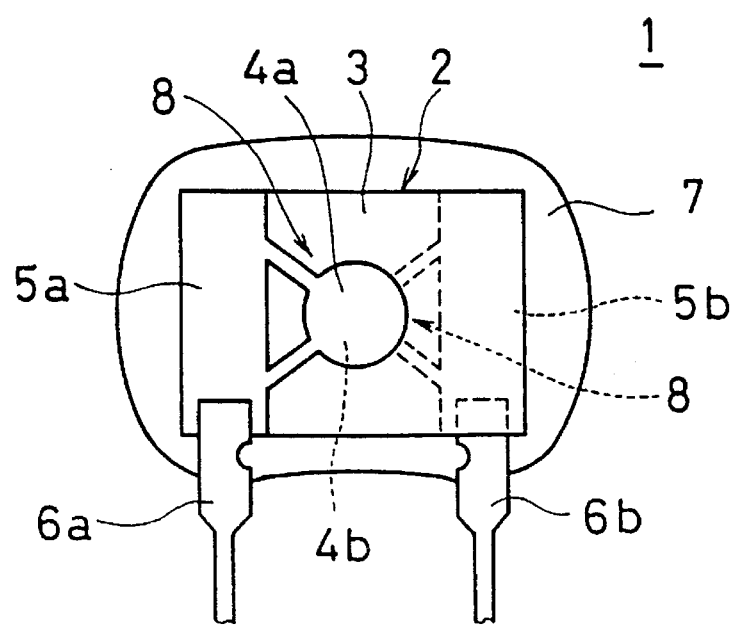
FIG. 4 is a sectional illustrative view of the oscillator shown in FIG. 3.
Figure 5:
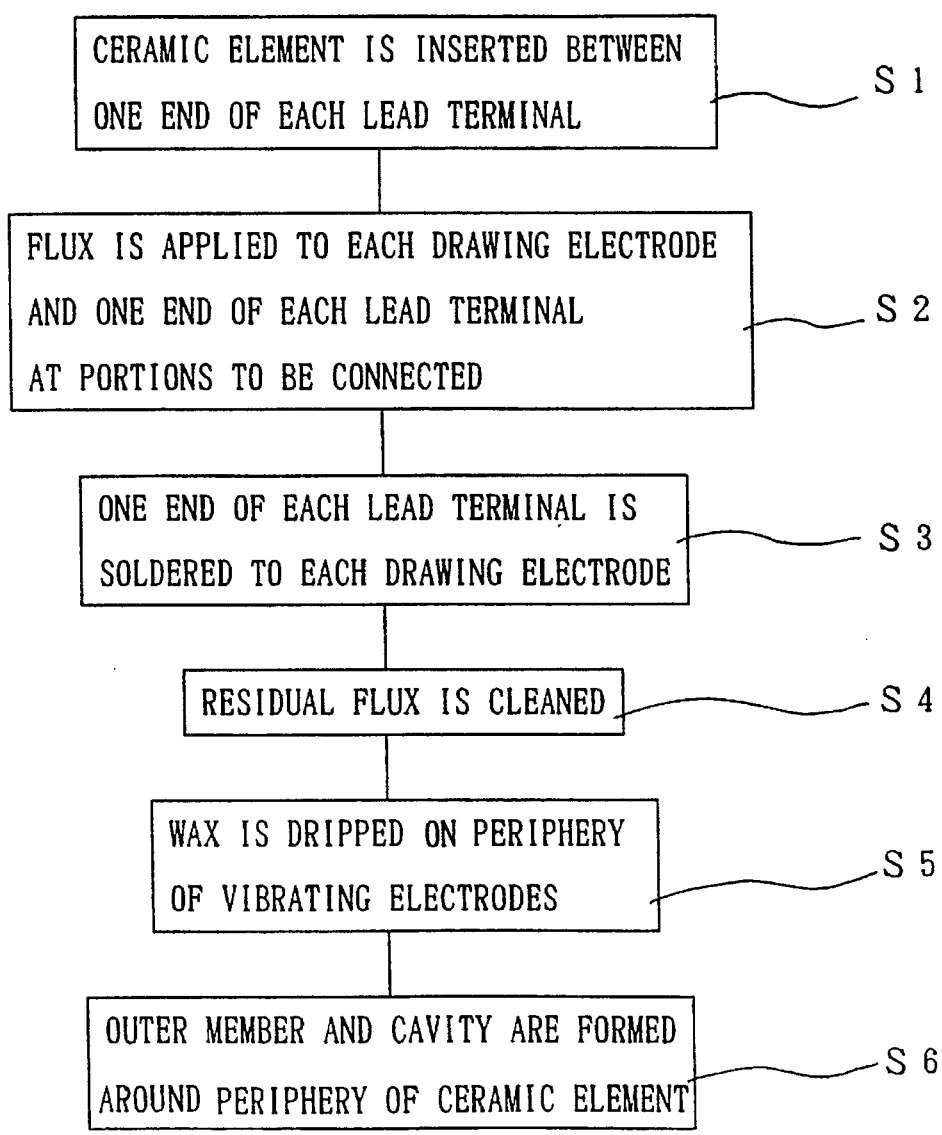
FIG. 5 is a flowchart showing an example of a conventional method for manufacturing the oscillator shown in FIGS. 3 and 4.

FIG. 1 is a flowchart showing an embodiment of the present invention for manufacturing the oscillator 1 shown in FIGS. 3 and 4.

In the embodiment shown in FIG. 1, at a step S11, a flux containing an activator of nonionic halogen group is applied to one end of each of the lead terminals 6a and 6b wherein the lead terminals 6a and 6b are spaced at a predetermined interval from each other and extending from a frame (not shown). It is preferable to use a flux wherein a residual flux remaining after soldering is a small amount. As a flux, for example, RMA22 manufactured by Senju Metal Co., Ltd. is used.

At a step S12, the ceramic element 2 is inserted between one end of the lead terminal 6a and one end of the lead terminal 6b. In this case, one end of the lead terminal 6a is placed on the drawing electrode 5a of the ceramic element 2. Similarly, one end of the lead terminal 6b is placed on the drawing electrode 5b of the ceramic element 2.

At a step S13, the drawing electrode 5a and one end of the lead terminal 6a are connected with each other by soldering. Similarly, the drawing electrode 5b and one end of the lead terminal 6b are connected with each other by soldering. At this time, a residual flux remains on the periphery of one end of each of the lead terminals 6a and 6b.

At a step S14, a wax 9 is dripped at a portion corresponding to the cavity 8 to be formed around the periphery of the vibrating electrodes 4a and 4b of the ceramic element 2. In this case, since a part of the residual flux remains at the edge of the ceramic element 2, a part of the residual flux is not covered with the wax 9.

At a step S15, the outer member 7 and the cavity 8 are formed around the periphery of the ceramic element 2 and so on.

Figure 2A:
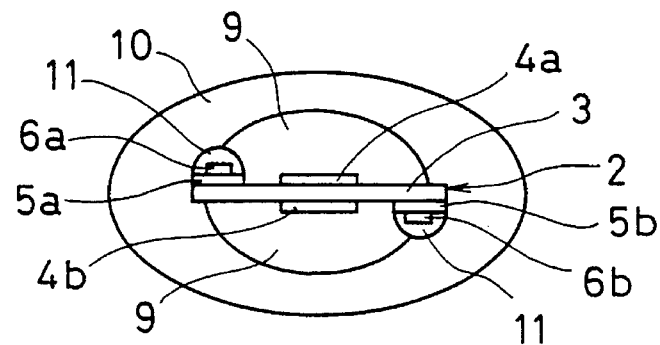
FIGS. 2(A)–(D) are illustrative views showing a process for absorbing a residual flux and a wax in the embodiment shown in FIG. 1.

The step S15 comprises a plurality of steps. At a first step, as shown in FIG. 2(A), an outer resin 10 to form the outer member 7 is applied to the periphery of the ceramic element 2, the wax 9, and the residual flux 11. The outer resin 10 consists of a mixture of a thermosetting resin, a solvent, and a filler.

Figure 2B:
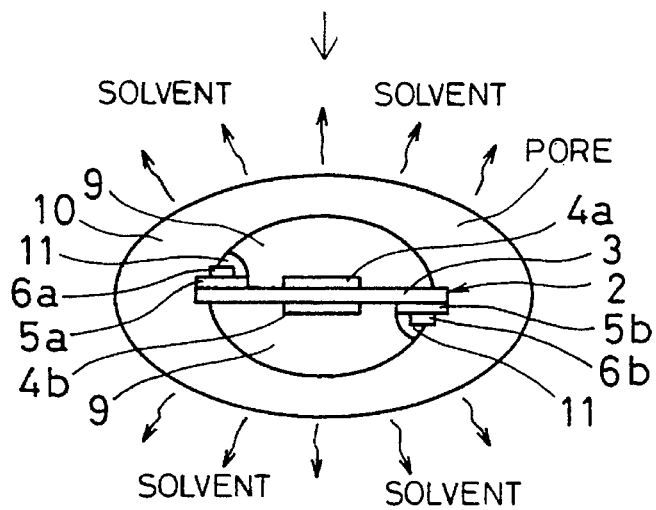

At a second step, by drying the outer resin 10, as shown in FIG. 2(B), the solvent contained in the outer resin 10 is dispersed to the outside, and pores are formed in the outer resin 10 on paths through which the solvent has been dispersed. At the same time, a part of the residual flux 11 is liquefied with the solvent contained in the outer resin 10, and absorbed into the pores of the outer resin 10. Preferably, the pores are formed in the outer resin 10 to approximately 30%, because if the pores are formed therein at a very high percentage, it is difficult to form the effective outer member 7 by the outer resin 10, while if the pores are formed therein at a very low percentage, it is difficult to absorb or disperse the residual flux 11 and the wax 9.

Figure 2C:
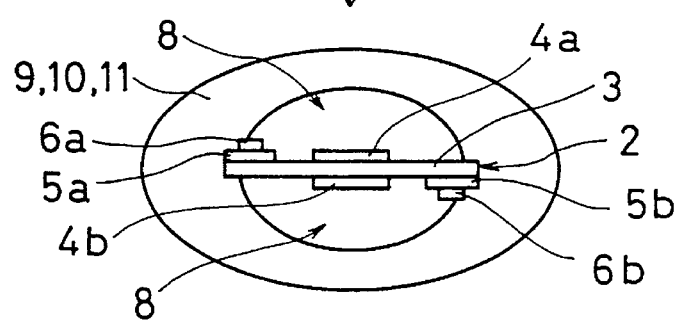
Figure 2D:
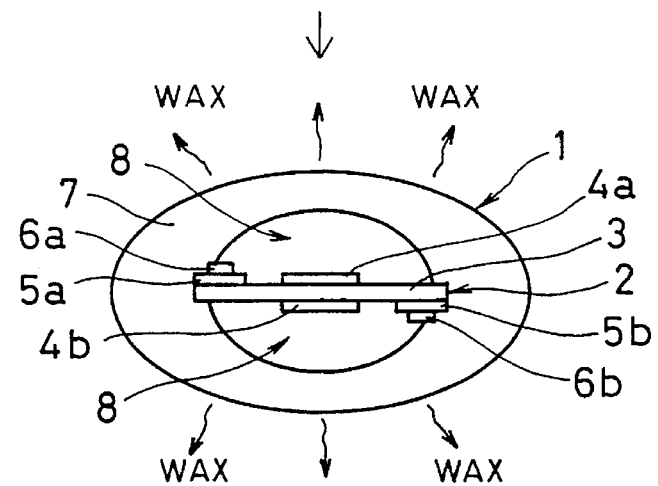

Then, the whole is heated to 150° C. to harden the outer resin 10. At a third step, when the whole is heated, as shown in FIG. 2(C), the wax 9 and the remaining part of the residual flux 11 are melted and absorbed simultaneously into the pores of the outer resin 10. As a result, the cavity 8 is formed around the periphery of the vibrating electrodes 4a and 4b. In this case, the wax 9 and the remaining part of the residual flux 11 become compatible or mixed with each other. At a fourth step, when the whole has been heated to 150° C., as shown in FIG. 2(D), the outer resin 10 is hardened, and the outer member 7 is formed on the periphery of the ceramic element 2 and the cavity 8. At the same time, a part of the wax 9 absorbed into the outer resin 10 is dispersed to the outside. Then, the lead terminals 6a and 6b are cut off from the frame (not shown).

In the above-mentioned embodiment, since a flux containing an activator of nonionic halogen group is used in soldering the ceramic element as an electronic element and the lead terminals to each other, a residual flux remained after soldering them has little corrosivity. Thus, the vibrating electrodes and the drawing electrodes of the ceramic element and the lead terminals are hardly corroded by the residual flux. Further, the residual flux is absorbed into the outer resin to be used as the material of the outer member. Thus, the residual flux does not remain on the periphery of the drawing electrodes and the vibrating electrodes of the ceramic element, the lead terminals and so on.

In the above-mentioned embodiment, since the electronic element has the vibrating electrode and the cavity is formed around the periphery of the vibrating electrode, the cavity operates as the vibrating space for the vibrating electrode.

According to the above-mentioned embodiment, the reliability of the oscillator as an electronic component having a vibrating electrode is maintained without cleaning the residual flux with a solvent containing chlorine.

Further, in the above-mentioned embodiment, compared with the conventional method shown in FIGS. 5 and 6(A)–(D), since the flux is applied to only each end of the lead terminals, an amount of a flux applied for soldering the ceramic element and the lead terminals to each other becomes small, and hence, the amount of residual flux to be treated is small. On the other hand, in the conventional method shown in FIGS. 5 and 6(A)–(D), since the flux is applied to both of the ceramic element as an electronic element and the lead terminals, an amount of a flux applied becomes large, and hence, the amount of the residual flux to be treated is large. Meanwhile, in the present invention, instead of applying the flux to only the lead terminal at the portion to be soldered, it is possible to apply the flux to only the electronic element at the portion to be soldered. It is also possible to apply the flux to both of the electronic element and the lead terminal at portions to be soldered.

In the above-mentioned embodiment, when the wax is dripped, a part of the residual flux is not covered with the wax. But, in the present invention, the entire residual flux may be covered with the wax. Further, the wax may be applied by a method other than dripping method.

In the above-mentioned embodiment, the whole is heated to 150° C. to harden the outer resin. But, it is possible to heat the whole to a temperature other than 150° C. depending on the kind of an outer resin.

In the above-mentioned embodiment, an example of the method for manufacturing the oscillator having two lead terminals has been described. But, the present invention is applicable to a method for manufacturing an oscillator having three or more lead terminals.

Also, the present invention is applicable to a method for manufacturing another electronic component having an electronic element, a lead terminal soldered to the electronic element, and the outer member formed around the periphery of the electronic element, and not having a vibrating electrode and a cavity. In this case, no wax need be applied by the dripping method or the like.

It will be apparent from the foregoing that, while the present invention has been described in detail and illustrated, these are only particular illustrations and examples, and the invention is not limited to these. The spirit and scope of the invention is limited only by the appended claims.

What is claimed is:

1. A method for manufacturing an electronic component having an electronic element, a lead terminal soldered to said electronic element, and an outer member formed around a periphery of said electronic element, comprising:
    a step of applying a flux containing an activator of nonionic halogen group to at least one of said electronic element and said lead terminal at a portion to be soldered;
    a step of soldering said electronic element and said lead terminal to each other;
    a step of applying an outer resin around the periphery of said electronic element;
    a step of absorbing a residual flux into said outer resin; and
    a step of forming said outer member by hardening said outer resin.

2. A method for manufacturing an electronic component according to claim 1, wherein said electronic element is a ceramic element having a vibrating electrode formed on a substrate.

3. A method for manufacturing an electronic component according to claim 2, wherein said electronic component is an oscillator.

4. A method for manufacturing an electronic component according to claim 2, which further comprises a step of forming a cavity around a periphery of said vibrating electrode.

5. A method for manufacturing an electronic component according to claim 4, wherein said step of forming said cavity includes:
    a step of applying a wax to the periphery of said vibrating electrode before performing said step of applying said outer resin; and
    a step of absorbing said wax into said outer resin after performing said step of applying said outer resin.

6. A method for manufacturing an electronic component according to claim 5, wherein said step of absorbing said residual flux and said step of absorbing said wax are performed simultaneously.

7. A method for manufacturing an electronic component according to claim 1, wherein said step of applying said outer resin includes a step of applying an outer resin containing a solvent to the periphery of said electronic element;
    said step of absorbing said residual flux includes:
    a step of forming pores in said outer resin by dispersing said solvent contained in said outer resin to the outside; and
    a step of absorbing said residual flux into said pores formed in said outer resin.

* * * * *